United States Patent [19]
Hirota et al.

[11] Patent Number: 4,705,204
[45] Date of Patent: Nov. 10, 1987

[54] METHOD OF BALL FORMING FOR WIRE BONDING

[75] Inventors: Jitsuho Hirota; Kazumichi Machida; Noriko Watanabe, all of Hyogo, Japan

[73] Assignee: Mitsubishi Denki Kabushiki Kaisha, Tokyo, Japan

[21] Appl. No.: 824,744

[22] Filed: Jan. 31, 1986

[30] Foreign Application Priority Data

| Mar. 1, 1985 | [JP] | Japan | 60-40624 |
| Mar. 8, 1985 | [JP] | Japan | 60-47034 |
| Mar. 13, 1985 | [JP] | Japan | 60-49785 |
| Mar. 13, 1985 | [JP] | Japan | 60-49786 |
| Mar. 13, 1985 | [JP] | Japan | 60-49787 |

[51] Int. Cl.$^4$ ........................... H01L 21/60
[52] U.S. Cl. ................. 228/179; 219/56.22; 219/69 M
[58] Field of Search .......... 228/4.5, 179, 170; 219/56.22, 69 M

[56] References Cited

U.S. PATENT DOCUMENTS

| 3,357,090 | 5/1963 | Tiffany | 228/110 |
| 3,358,897 | 12/1967 | Christensen | 228/41 |
| 3,843,428 | 10/1974 | Kraft | 156/7 |
| 3,934,108 | 1/1976 | Howard | 219/85 R |
| 4,151,545 | 4/1979 | Schnepf et al. | 357/71 |
| 4,323,759 | 4/1982 | Edson et al. | 219/56.22 |
| 4,390,771 | 6/1983 | Kurtz et al. | 219/56.22 |
| 4,459,452 | 7/1984 | Carter | 219/56.22 X |
| 4,476,366 | 10/1984 | Kurtz et al. | 219/56.22 |
| 4,564,734 | 1/1986 | Okikawa | 219/56.22 |

FOREIGN PATENT DOCUMENTS

| 0111427 | 6/1984 | European Pat. Off. . |
| 138454 | 2/1903 | Fed. Rep. of Germany . |
| 201117 | 8/1908 | Fed. Rep. of Germany . |
| 2517017 | 10/1976 | Fed. Rep. of Germany . |
| 2832050 | 2/1979 | Fed. Rep. of Germany . |
| 3023528 | 1/1982 | Fed. Rep. of Germany . |
| 3037735 | 5/1982 | Fed. Rep. of Germany . |
| 3104960 | 8/1982 | Fed. Rep. of Germany . |
| 3141842 | 10/1982 | Fed. Rep. of Germany . |
| 3435489 | 5/1985 | Fed. Rep. of Germany . |
| 2524704 | 12/1985 | France . |

*Primary Examiner*—Kenneth J. Ramsey
*Attorney, Agent, or Firm*—Sughrue, Mion, Zinn, Macpeak & Seas

[57] ABSTRACT

A ball-type bonding wire for use in connecting electrodes of semiconductor devices with external connector terminals and a method for producing such a wire in which the material of the wire can be a material such as aluminum, copper, palladium, alloys thereof, and combinations thereof. In forming the wire, the tip of the wire is disposed opposite a consumable electrode in an inert atmosphere, and a voltage is applied between the wire and the electrodes so as to cause a discharge between the tip of the wire and the consumable electrode. The polarity of this voltage is such that the majority of the energy contained in the discharge and supplied to the wire is produced when the wire is positive with respect to the consumable electrode.

8 Claims, 12 Drawing Figures

METHOD OF BALL FORMING FOR WIRE BONDING

BACKGROUND OF THE INVENTION

The present invention relates to bonding wires for use in fabricating semiconductor devices and to a method for producing such bonding wires. Particularly, the invention relates to ball-type bonding wires used in forming connections to electrodes of semiconductor chips.

Gold has been widely employed as the material of bonding wires used in semiconductor devices. However, since gold is expensive and since the long-term reliability of connections between a gold wire and an aluminum electrode on a semiconductor chip is relatively low, it has been proposed to use instead copper, aluminum, palladium, or certain alloys of these elements. Particularly, an aluminum alloy containing 2.0% magnesium and an aluminum alloy containing 1.0% silicon are recognized as acceptable, as disclosed in Johnson et al., "Ultrasonic Wire Welding", Solid State Technology, vol. 20, pages 91–95, April 1977, and Gehman et al., "Aluminum Wire for Thermosonic Ball Bonding in Semiconductor Devices", Solid State Technology, vol. 26, pages 151–158, October 1983.

As disclosed in these articles, in order to eliminate the directional restriction of the wire when connected to the electrode of the semiconductor device, a tip of the metal wire is shaped into a ball. The shaping of the tip of the wire is usually performed by applying a high d.c. voltage between the tip of the wire and a consumable electrode to form an electric discharge therebetween and thereby melt the tip and shape it to a ball by surface tension. In such a case, a positive potential is applied to the electrode and a negative potential is applied to the wire in view of ease of insulation breakdown.

FIG. 1a illustrates ball formation at the tip of a metal wire 1 made of copper or aluminum using the same method as that used for ball formation at the tip of a gold wire. In FIG. 1a, the metal wire 1, supported by a capillary chip 5 which is also used as a bonding tool, is disposed opposite a consumable electrode 2 in an inert gas atmosphere 7 of a gas such as argon. A d.c. source 4 is connected between the wire 1 and the electrode 2 with the positive and negative terminals of the d.c. source 4 being connected to the electrode 2 and the wire 1, respectively. An arc 3 is thereby formed between the wire 1 and the electrode 2. Due to the discharge, the tip portion of the metal wire 1 is heated and melted.

Thermal electron emission at the negative potential side tends to occur in areas whose work function is smaller than other areas, that is, in areas in which more stable emission than other areas is possible. Since the wire 1 of copper or aluminum has a naturally formed oxide film several tens of angstrom thick on its surface, the area where thermal electron emission occurs tends to expand, as shown by the hatched in FIG. 1a. Therefore, heat is applied to such a widened area, resulting in a defective ball 8 having a non-melted portion 1a formed around the tip of the wire 1, as shown in FIG. 1b. Such a non-melted portion 1a causes minute cracks to be produced in a silicon chip when the defective ball 8 is bonded to one of its pads, even if such a portion exists invisibly within the ball 8. (There is no such problem for gold wire because no oxide film forms on a gold wire.)

Further, when copper wire is used, to provide acceptable bonding characteristics to an electrode of a semiconductor device, the wire should have a hardness compatible with that of the electrode of the semiconductor device, which pad is usually made of aluminum. The Vickers hardness of an aluminum pad is about 30 to 40, which is acceptable for gold wire. However, since ordinary copper has a Vickers hardness of 60 or more, it generally has not been preferable to use copper for bonding wires.

Further, it has been known that the shear strength of an aluminum pad formed by vapor deposition of highly pure aluminum is as low as 5 to 7 kg/mm$^2$, and, when a wire of copper of the like is bonded to such pad and the semiconductor device molded in resin, breakage or deformation of the aluminum pad may occur during the molding process. That is, if the molding resin is of the thermoplastic type, the molding temperature is about 300° C., and if it is a low temperature resin, the molding must be performed under a high pressure. In such cases, the conventional aluminum pad, having a low shear strength, cannot withstand the high temperature or high pressure.

SUMMARY OF THE INVENTION

An object of the present invention is to provide a ball bonding technique which allows the use of copper, aluminum or palladium, or an alloy or combination thereof, as a metal bonding wire for semiconductor devices capable of reliable bonding to aluminum pads.

Another object of the present invention is to provide an improved method of forming a ball at a tip portion of a metal wire.

A further object of the present invention is to provide a method of improving the mechanical strength of an aluminum pad of a semiconductor device.

In accordance with the above another object, the invention provides a method for forming a ball at a tip of a metal wire so as to produce a wire suitable for use in forming interconnections between pads of a semiconductor device and externally extending terminals, in which the improvement comprises the step of connecting an electric power source between the metal wire and a consumable electrode so as to cause a discharge to occur between the tip of the wire and the consumable electrode with the polarity of the voltage source being such that, of the energy contained in the discharge, a majority is produced when the wire is positive with respect to the consumable electrode. The wire may be made of a material such as aluminum, copper, palladium, or alloys or combinations of aluminum, copper and palladium. The discharge occurs in an inert gas or reducing atmosphere, preferably, such an atmosphere having an oxygen concentration of not more than 5000 ppm.

Preferably, the hardness of a balls thus formed and the pad of the semiconductor devices to which it is to be bonded are similar. To harden the pads of the semiconductor device, a minute amount of an impurity can be added thereto. To soften the wire, for instance if it is a copper wire, a metal purity of not less than 99.99% is preferred.

BRIEF DESCRIPTION OF THE DRAWINGS

FIG. 3 is a graph showing acceptable discharge currents and discharge times to be used in the ball formation technique illustrated in FIG. 2a;

FIGS. 5a and 5b show waveforms of voltages suitable for use in the ball formation techniques illustrated in FIG. 4a;

DESCRIPTION OF THE PREFERRED EMBODIMENTS

Figure 1A:
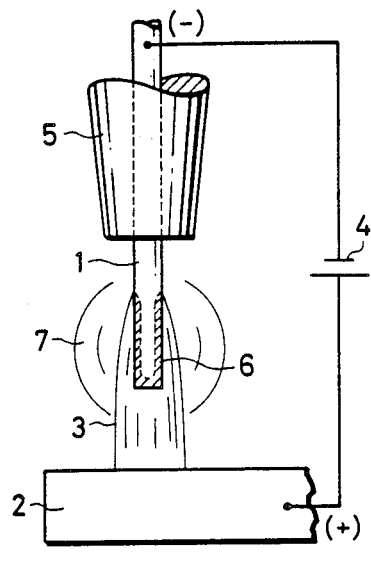
FIGS. 1a and 1b respectively illustrate conventional ball formation at the tip of a metal wire and the resulting ball.
Figure 1B:
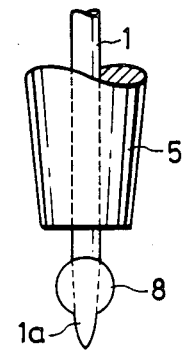
Figure 2A:
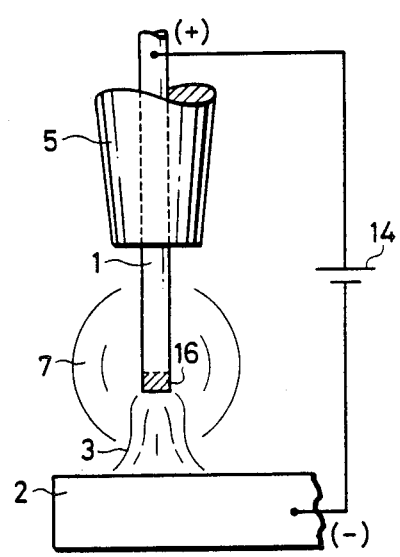
FIGS. 2a and 2b respectively illustrate ball formation according to a preferred embodiment of the present invention and the resulting ball.

FIG. 2a illustrates a preferred embodiment of a method of forming a bonding wire of the present invention, which is similar to FIG. 1a except that the polarity of the voltage applied by a d.c. voltage source 14 between a metal wire 1, made of copper, aluminum, palladium or an alloy of combination thereof, and a consumable electrode 2 is reversed.

That is, the wire 1, supported by a capillary chip 5 acting as a bonding tool is connected to the positive terminal of a d.c. high voltage source 14, and the consumable electrode 2 is connected to the negative terminal thereof. The discharge region is held in an inert gas atmosphere of a gas such as argon to prevent oxidation of molten portions of the wire 1.

Figure 2B:
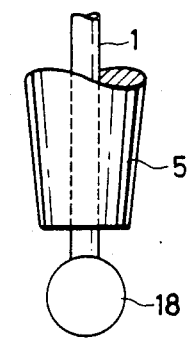

With this arrangement, only the tip portion 6 of the wire 1 is heated when thermal electron emission occurs on the surface of the electrode 2, and thus only the tip portion is melted. That is, the molten portion is defined strictly at the tip portion of the wire 1, resulting in a completed ball 18 as shown in FIG. 2b.

The stability of the discharge between the wire tip at the positive potential and the consumable electrode at the negative potential may be degraded to some extent compared with the case where the opposite potentials are employed. However, it has been found by the present inventors from analysis of the phenomena of melting of a wire having a diameter of 25 microns and tip ball formation that a non-melted portion is unavoidably left in a portion of wire when the polarities of the wire and the electrode are negative and positive, respectively. According to the present invention, the stability of the discharge is improved by increasing the voltage and using an inert shielding gas such as argon, which can more readily be converted to a plasma than air.

In order to stably form a ball 18 having a diameter two to three times that of the metal wire 1 for a wire of diameter in a range of 15 to 35 microns, the discharge current and discharge time may be selected suitably from ranges of 30 to 200 mA and 1 to 10 msec, respectively.

Figure 3:
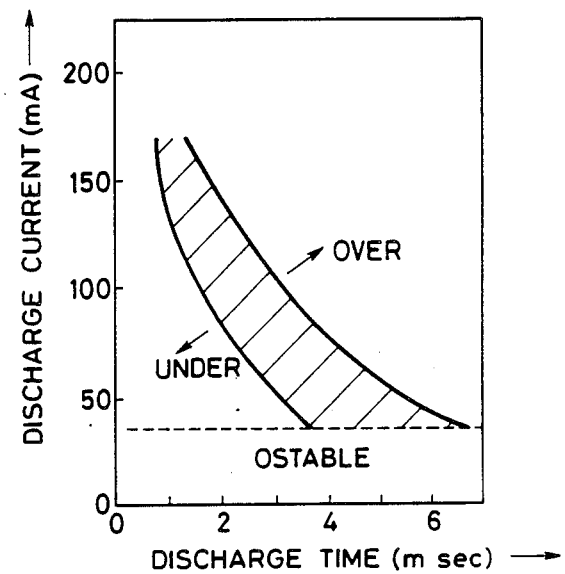

FIG. 3 is a graph showing experimental data of discharge current and discharge time obtained for a copper wire having diameter of 25 microns. In FIG. 3, the hatched area shows preferred range of these parameters.

In the above-described embodiment, only the tip portion of the wire is heated and it is heated concentrically to thereby melt that portion completely, resulting in a ball having no non-melted portion. Although this method is very effective, there may occur a problem in some situations in that, due to such complete melting, the mechanical strength of the neck portion (the boundary portion between the ball portion and the wire portion) is lowered during a bonding operation, resulting in looping of the wire portion or breakage of the neck portion. This may be ameliorated by leaving the neck portion partially non-melted.

According to another embodiment of the present invention, the above problem is effectively eliminated by making the discharge voltage applied between the wire and the consumable electrode alternating with the electric energy when the polarity of the wire is positive being larger than that when the polarity is negative.

Figure 4A:
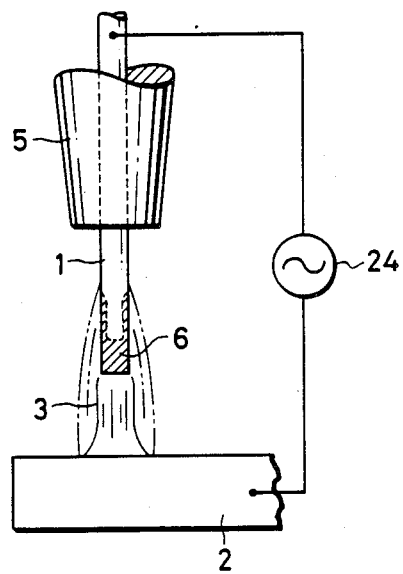
FIGS. 4a and 4b respectively illustrate ball formation according to another embodiment of the present invention and the resulting ball.
Figure 4B:
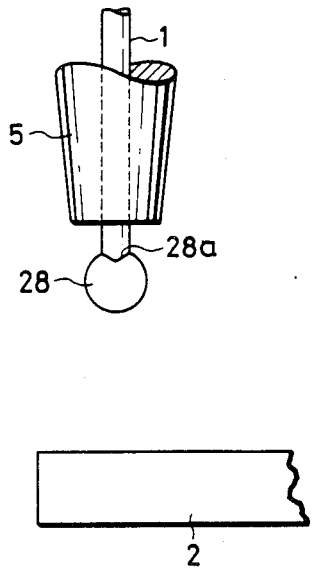

FIG. 4a illustrates an arc when an alternating voltage is applied by an a.c. source 24 between the wire 1 and the discharge electrode 2. In FIG. 4a, when the polarity of voltage applied to the wire is positive, an arc 3 is formed between the tip of the wire and the discharge electrode 2, as shown by solid lines, whereupon the tip portion is concentrically heated as in the preceding embodiment. When the voltage polarity of the wire is switched to negative, the arc 3 tends to form in a wider area of the wire, as shown by chain lines, as in the conventional ball formation process for gold wire. By repeating the alternating polarity cycles to the applied voltage, a small non-melted portion 28a is left in the neck portion of a ball 28, as shown in FIG. 4b. The discharge region may be held in an inert gas atmosphere to prevent oxidation during melting as in the preceding embodiment.

Figure 5B:
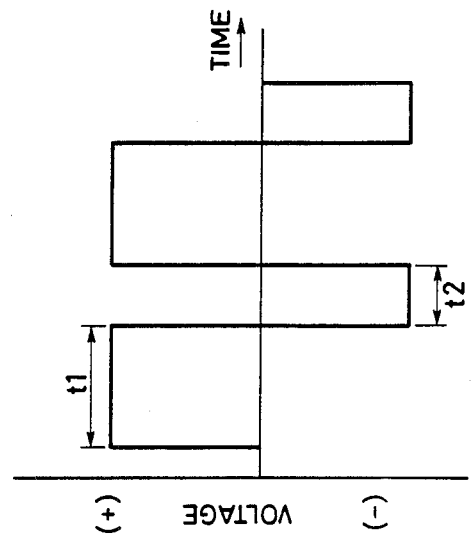
Figure 5A:
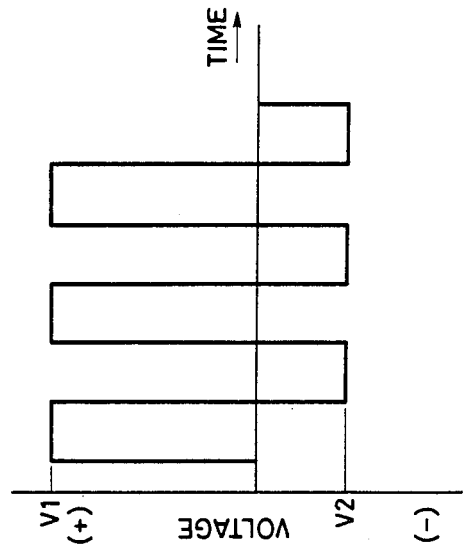

In order to form such a non-melted portion 28a efficiently, the voltage applied to the wire 1 should be selected so that the electric energy supplied to the wire 1 when the polarity is positive is larger than that when the polarity in negative. For example, the voltage $V_1$ applied to the wire 1 when its polarity is positive is made larger than the voltage $V_2$ applied to the wire when its polarity is negative, as shown in FIG. 5a. Alternatively, it is possible to make the time $t_1$ for which the voltage of a positive polarity is applied to the wire 1 longer than the time $t_2$ for which the voltage of negative polarity is applied, as shown in FIG. 5b. Empirically it has been found preferable that the ratio of the energy supplied to the wire when its polarity is positive to the energy supplied thereto when its polarity is negative is about 3 to 4.

The above embodiments have been described as using an electrode wire made of any of copper, palladium, aluminum, or alloys or combination thereof. It should be noted that, in order to obtain good bonding, the hardness of the ball formed at the tip of the wire must be compatible with the hardness of the electrode on the semiconductor chip to which the wire is to be bonded, which electrode is usually made of aluminum. The Vickers hardness Hv of an aluminum electrode is usually in a range of 35 to 40, while that of the ball formed at the tip of the copper wire is 60 or more. Therefore, the hardness of a copper wire is too high to obtain good bonding to an aluminum electrode.

In order to make the hardness of the wire and the electrode compatible with each other, it is necessary to either lower the hardness of the copper wire or increase the hardness of the aluminum electrode. As to the copper wire, the copper should be as pure as possible, preferably 99.99% or more. By using such copper, the hardness of the wire can be lowered to about 50 to 60 Hv. In addition, in order to prevent oxygen from mixing into the ball and to thereby restrict any hardness increase caused thereby to prevent degradation of the roundness of the resulting ball due to oxide film formation, the oxygen concentration of the inert gas or reducing gas should be 5000 ppm or less.

It has been found by the inventors that the hardness of the aluminum electrode can be increased by adding thereto a minute amount of an impurity. The impurity may be selected from materials such as Mn, Mg, Cu and/or Si, or gases such as $O_2$, $N_2$, etc., and the amount thereof may be 10 to 5000 ppm. The hardness of aluminum containing such an impurity is increased to 45 to 60 Hv, which is compatible with hardness of the copper wire. Furthermore, other mechanical properties of the aluminum electrode are also improved by the addition of the impurity. For example, the shear strength of an ordinary aluminum electrode is only about 5 to 7 kg/mm$^2$, which is not sufficient for the wire to withstand the subsequent molding process for encapsulating the semiconductor chip in resin. That is, the semiconductor chip is usually molded with a resin which may be of the thermoplastic type, in which case molding is carried out at a high temperature. When an ordinary aluminum pad is sujected to such conditions, it tends to break or deform internally, causing the resultant device to be unstable in operation.

Figure 6:
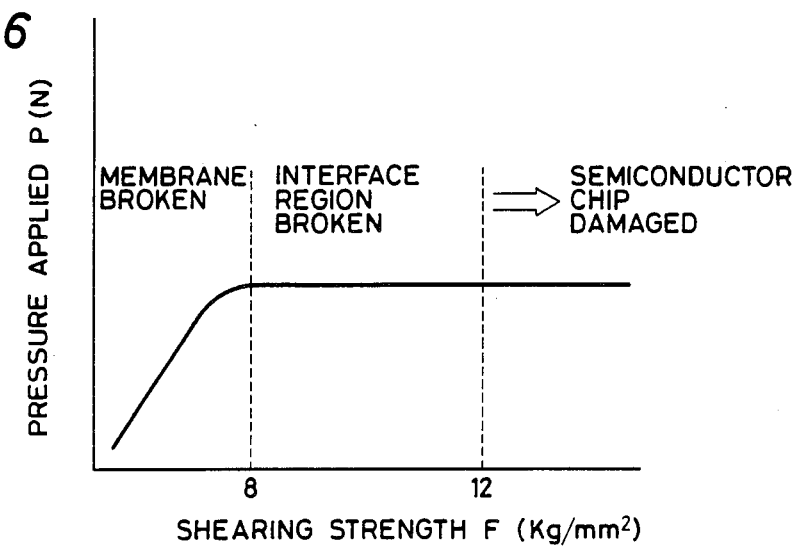
FIG. 6 is a graph showing the relation between the shear strength of an aluminum electrode and the pressure under which the aluminum electrode is damaged.
Figure 7:
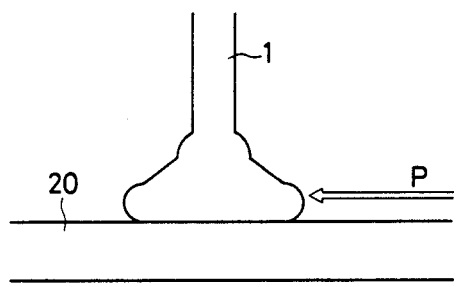
FIG. 7 illustrates an application of pressure to a ball-type bonding wire to obtain the relation of FIG. 6.

FIG. 6 is a graph obtained by plotting critical values P of pressure applied in a direction shown by a double arrow in FIG. 7, which illustrates a copper wire 1 ball-bonded to an aluminum electrode 20 formed on a silicon chip and measured when the aluminum pad is broken, with the shear strength of the aluminum pad being taken as a parameter. It is clear from FIG. 6 that the pressure value P increases with shear strength in a range below about 8 kg/mm$^2$. The damage to the aluminum electrode subjected to the critical pressure in this range is usually inner breakage of the pad. On the other hand, for an aluminum electrode having a shear strength of about 8 to 12 kg/mm$^2$, the damage which occurs is breakage of only interface regions thereof, while for an electrode having a shear strength larger than 12 kg/mm$^2$, the semiconductor chip is damaged due to the inner stress of the electrode. Therefore, the shear strength of the aluminum electrode should be in a range of about 8 to 12 kg/mm$^2$.

Figure 8:
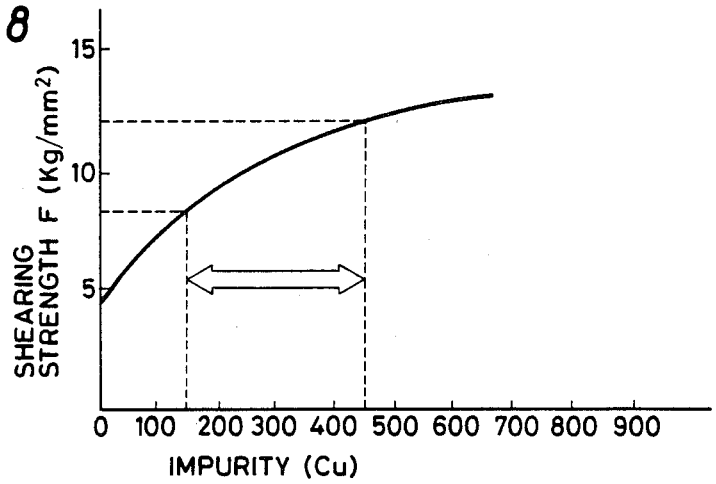
FIG. 8 is a graph showing the improved shear strength of an aluminum electrode according to the present invention.

FIG. 8 is a graph showing the relation of the shear strength of an aluminum film to the amount of impurity contained therein when copper is selected as the impurity. From FIG. 8, it is clear that the shear strength of the aluminum film increases with an increase in the amount of the impurity, and the desired shear strength is obtained when the amount of copper is in a range of about 100 to 500 ppm.

As described hereinbefore, according to the present invention, ball-type non-gold bonding wires are greatly improved by improving the ball formation at the tip of the wire, lowering the hardness of the ball, and increasing the mechanical strength of the aluminum electrode.

We claim:

1. In a method of forming a ball at the tip of a metal wire for ball bonding, the improvement comprising the steps of: connecting an alternating electric power source between said metal wire and a consumable electrode so as to cause a discharge between a tip of said wire and said consumable electrode, and operating said power source so as to produce an alternating voltage for which an amount of electric energy supplied to said wire during a first time period for which said wire is positive with respect to said consumable electrode is larger than an amount of energy which is supplied to said wire during a second time period for which said wire is negative with respect to said consumable electrode, thereby melting said tip and accurately shaping it into a ball.

2. The method as claimed in claim 1, wherein a difference in said amounts of energy for said first and second time periods is produced by making a voltage in said first time period larger than a voltage in said second time period.

3. The method as claimed in claim 1, wherein a difference in said amounts of energy for said first and second time periods is produced by making said first time period longer than said second time period.

4. The method as claimed in claim 1, wherein said wire is made of a material selected from the group consisting of aluminum, copper, palladium, and alloys and combinations of aluminum, copper and palladium.

5. The method as claimed in claim 1, further comprising the step of ball-bonding said wire to an electrode of a semiconductor chip.

6. The method as claimed in claim 1, wherein at least a region in which said electric discharge is produced is disposed in an inert or reducing gas atmosphere.

7. The method as claimed in claim 1, wherein said wire is made of copper, and said ball is formed in an inert or reducing gas atmosphere having an oxygen concentration of not more than 5000 ppm.

8. The method as claimed in claim 1, wherein a ratio of said amount of electric energy supplied to said wire during said first time period to said amount of electric energy supplied to said wire during said second time period is in a range of approximately 3:1 to 4:1.

* * * * *